(12) United States Patent
Dai et al.

(10) Patent No.: US 11,206,163 B2
(45) Date of Patent: *Dec. 21, 2021

(54) RADIO FREQUENCY (RF) TO DIGITAL POLAR DATA CONVERTER AND TIME-TO-DIGITAL CONVERTER BASED TIME DOMAIN SIGNAL PROCESSING RECEIVER

(71) Applicant: Auburn University, Auburn, AL (US)

(72) Inventors: Fa Dai, Auburn, AL (US); Hechen Wang, Auburn, AL (US)

(73) Assignee: Auburn University, Auburn, AL (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/205,960

(22) Filed: Mar. 18, 2021

(65) Prior Publication Data

US 2021/0250213 A1    Aug. 12, 2021

Related U.S. Application Data

(60) Continuation of application No. 16/933,485, filed on Jul. 20, 2020, now Pat. No. 10,958,491, which is a
(Continued)

(51) Int. Cl.
*H04L 27/22* (2006.01)
*H04L 7/00* (2006.01)
(Continued)

(52) U.S. Cl.
CPC ............... *H04L 27/22* (2013.01); *H03L 7/08* (2013.01); *H04B 1/00* (2013.01); *H04L 7/0079* (2013.01)

(58) Field of Classification Search
CPC ......... H04L 27/22; H04L 7/0079; H03L 7/08; H04B 1/00; H03D 7/165; H03D 3/006
(Continued)

(56) References Cited

U.S. PATENT DOCUMENTS 9,378,843 B1 * 6/2016 Hossain .................... G05F 1/10
10,476,540 B2   11/2019 Xu
(Continued)

*Primary Examiner* — Fitwi Y Hailegiorgis
(74) *Attorney, Agent, or Firm* — Christopher M. Scherer; DeWitt LLP

(57) ABSTRACT

The present disclosure includes a time-to-digital converter (TDC) based RF-to-digital (RDC) data converter for time domain signal processing polar receivers. Polar data conversion achieves better SNR tolerance owing to its phase convergence near the origin in a polar coordinate. The proposed RDC consists of a TDC for phase detection and an analog-to-digital converter (ADC) for amplitude conversion. Unlike the conversional data converter, the proposed ADC's sampling position is guided by the detected phase result from the TDC's output. This TDC assisted data-converter architecture reduces the number of bits required for the ADC. In addition, oversampling is no longer needed. With precisely controlled tunable delay cells and gain compensator, this hybrid data convertor is capable to directly convert Quadrature Amplitude Modulation (QAM) waveforms and Amplitude Phase Shift Keying (APSK) waveforms directly from the RF signal without down-conversion. Thus, the proposed RDC architecture achieves lower power consumption and better performance comparing with conventional I/Q receivers.

14 Claims, 9 Drawing Sheets

Related U.S. Application Data division of application No. 16/188,372, filed on Nov. 13, 2018, now Pat. No. 10,785,075.

(60) Provisional application No. 62/584,324, filed on Nov. 10, 2017.

(51) Int. Cl.
*H03L 7/08* (2006.01)
*H04B 1/00* (2006.01)

(58) Field of Classification Search
USPC .......................................................... 375/329
See application file for complete search history.

(56) References Cited

U.S. PATENT DOCUMENTS

| | | |
|---|---|---|
| 2008/0205571 A1 | 8/2008 | Muhammad |
| 2008/0315928 A1 | 12/2008 | Waheed |
| 2013/0088290 A1 | 4/2013 | Rapp |
| 2018/0267480 A1* | 9/2018 | Mahajan ................. G05F 1/561 |

* cited by examiner

RADIO FREQUENCY (RF) TO DIGITAL POLAR DATA CONVERTER AND TIME-TO-DIGITAL CONVERTER BASED TIME DOMAIN SIGNAL PROCESSING RECEIVER

CROSS-REFERENCE TO RELATED APPLICATION(S)

The present application is a continuation of U.S. application Ser. No. 16/933,485, filed Jul. 20, 2020, which application is a divisional of U.S. application Ser. No. 16/188,372, filed Nov. 13, 2018, which application claims priority to U.S. Provisional Application No. 62/584,324, titled TDC BASED HYBRID POLAR DATA CONVERTER AND TIME DOMAIN SIGNAL PROCESSING FOR RECEIVERS, filed Nov. 10, 2017, the contents of which are incorporated herein by reference in their entireties.

FIELD

The present invention relates to wireless radio receiver architecture. Particularly, the invention relates to the time to digital converter (TDC) based polar receiver.

BACKGROUND

There is an increasing interest to push mixed-signal/digital operations into RF front-ends. "Digital-RF" has stimulated much attention in research and commercial applications. Digitally assisted RF blocks can retain the full flexibility of various digital techniques such as digital waveform synthesis, digital modulation, digital signal processing, digital pre-distortion, digital calibration, digital self-healing and digital signal amplification. In order to handle versatile wideband complex modulations with high efficiency, software defined radios (SDR) need to be reconfigurable as far as its architecture concerned. Among various transmitter architectures, polar transmitter suffers from bandwidth expansion problems when converting data from I/Q to polar, while a digital I/Q transmitter has the largest power combining loss of 3 dB. As a compromise, a transmitter with multi-phase carriers can achieve small bandwidth expansion and low power combining loss, if multi-phase carriers can be generated with low power.

For wireless applications, "Digital-RF" can potentially obtain high precision, high dynamic range, low noise, and high power efficiency than their analog counterparts. Moreover, it retains the full flexibility of various digital techniques, e.g., direct digital modulation, digital signal processing, digital pre-distortion, digital waveform generation, digital calibration, digital assisted self-healing, digital power amplification and most importantly suitability for digital synthesis design flow, all of which will benefit future wireless transceiver designs. Semiconductor manufacturing has advanced tremendously in recent years such that it is possible to apply many traditionally digital-signal processing techniques to analog circuits. Analog circuit design flow can be greatly improved, if the following aspects can be revolutionized: transceiver architecture, digital assisted analog circuit and analog circuit synthesis.

SUMMARY

The system of the present application features a TDC based hybrid polar data converter 40 (FIG. 4) and time domain signal processing procedure corresponding to this data convertor (FIG. 6, 7) for wireless communication receiver converting a received baseband signal to a digitized data, and then further demodulating. The received analog baseband signal is split into two branches and is fed to both the TDC and ADC. The TDC path measures the signal's phase information, while the ADC is controlled by the TDC's output and captures the signal's amplitude. With the sampling position control mechanism, the ADC's number of bits can be greatly reduced by comparing it with a conventional I/Q topology, and both the ADC and TDC can sample the signal at the baseband signal's frequency without oversample. Multiple precisely controlled tunable delay cells and gain compensation blocks are inserted in the architecture to form a time domain signal processing and demodulation process. A high data throughput 1024-APSK modulation signal is enabled with the proposed receiver.

The system of the present application includes a time processing based transceiver in the backs and architecture that doesn't follow the traditional amplitude dependent waveform transmission and receiving. Instead, the frequency and phase information are extracted such that the requirement for amplitude detection is much relaxed, resulting in greatly reduced number of bits (NoBs) and power required for analog-to-digital converter (ADCs). With advanced technology, frequency and phase information can be accurately detected using time-to-digital converters (TDCs) that require much lower power. In addition, the system includes a multi-phase-carrier digital transceiver architecture with a broadband digital power amplifier (DPA) and all digital phase-locked loop (ADPLL) system, which can be adaptively reconfigured as an I/Q, a multi-phase carrier, or a polar transceiver for digital communications. The integrated ADPLL system takes the baseband information and synthesizes the desired baseband control signals independently for each DPA path, eliminating additional power hungry digital-to-analog converters (DACs).

Cartesian I/Q transceivers are widely used in nowadays wireless communication systems. Current wireless communication standards, such as GSM, WLAN and LTE, all require a large peak to average ratio, which leads to a large burden to the circuits on the I/Q signal path. To preserve the signal's peak to average ratio, those circuits need to have a high linearity. Namely, a large power consumption is required for I/Q transceivers. FIG. 1 gives a normal I/Q wireless transceiver architecture. Because the I/Q signals have varying envelope, all the building blocks in the signal path require a high linearity, which leads to a high power consumption level.

The high peak to average ratio in an I/Q architecture is due to the change of the signal amplitude. One solution to relieve this issue is to convert the I/Q signal into polar signal. In the polar architecture, the phase signal path has constant amplitude. Thus, there is no linearity requirement. The amplitude information can be added to the signal at the PA stage, the last stage of the transmitter, by using a DPA structure. A well-developed polar direct modulation transmitter architecture is presented in FIG. 2.

Polar transmitters have been in use and studied for decades. However, polar receivers have barely been studied during this time frame. One of the reasons for this lack of study is that the received signal becomes very tiny when it goes through a long distance transmission to the receiver. Although the linearity requirement is not as high as the transmitter part, the main burden of a receiver has been shifted to the ADC part and baseband signal processing part. For a conventional wireless local area network (WLAN)

receiver, the system calls for an ADC for each I and Q signal path. These ADCs require at least 10 number of bits and running at a minimum oversample ratio of 4, which is around 100 MS/s ADC sample rate. The ADC specifications mentioned above are feasible, but with large power consumption and cost.

One reason to pursue a polar receiver is that comparing with a conventional Cartesian I/Q receiver, a polar receiver requires less data converter bits when dealing with the same signal-to-noise ratio (SNR) level signal. FIG. 3 explains this advantage in an intuitive way. The first plot 10 illustrates a Cartesian I/Q conversion space 10. The dashed lines 12 indicate data converters' quantization level. In this example, the signals in both the I and Q axes are quantized into twelve levels. In the polar case as shown in second plot 20, the space has been quantized with sixteen phases and six amplitude levels by the dashed lines 22. Note that no matter dealing with large or small input signal, the I/Q converter's quantization resolution (small box) in plot 10 remains the same, while the polar converter plot 20 has large quantization resolution when the input signal is large and has finer quantization resolution when the signal has a small amplitude. In other words, the polar data converter's quantization steps are automatically adjusted based on input signal's amplitude, leading to improved SNR with the same number of bits for data converters. Because all the phases will finally converge to the origin, the quantization resolution will be infinite 1× magnified when the signal approaches zero. The last figure plot 30 in FIG. 3 shows a simulation comparison between I/Q and polar architecture when dealing with 16QAM and 64QAM signals. We can see that the polar architecture achieves much better results. In our proposed architecture for 16-QAM, we need only a two-bit ADC, which has a larger quantization step and noise margin, leading to improved noise tolerance, namely, less SNR requirement. This simulation shows the improved detection in noisy channel conditions. Since the polar receiver requires less number of bits for data conversion, it is a possible increase the intermediate frequency (IF) frequency. With a higher IF frequency, the design complexity of a receiver RF frontend can be reduced when dealing with image rejection and other issues.

BRIEF DESCRIPTION OF THE DRAWING(S)

The above and further advantages of this invention can be better understood by referring to the following description in conjunction with the accompanying drawings, in which.

Figure 9:
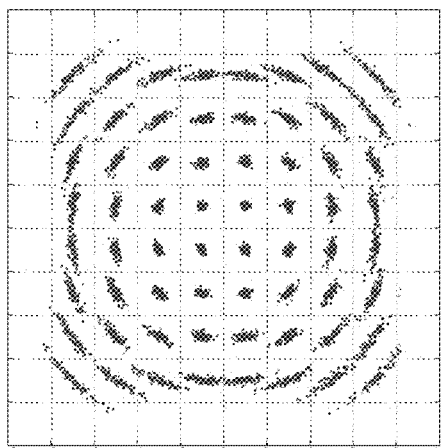
Figure 9:
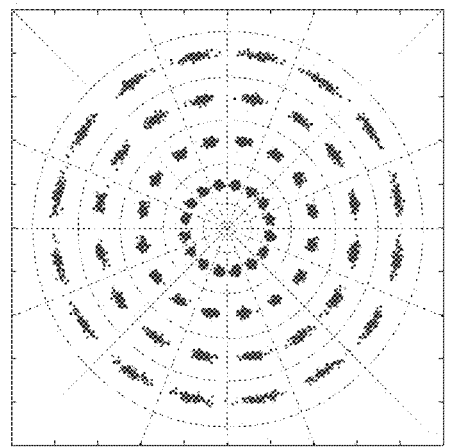
Figure 10:
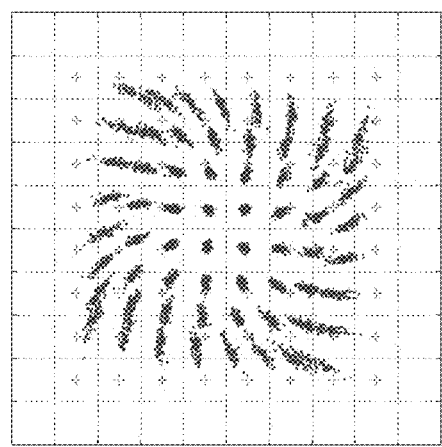
Figure 10:
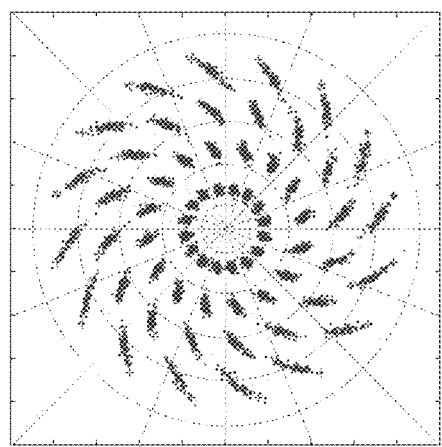
Figure 11:
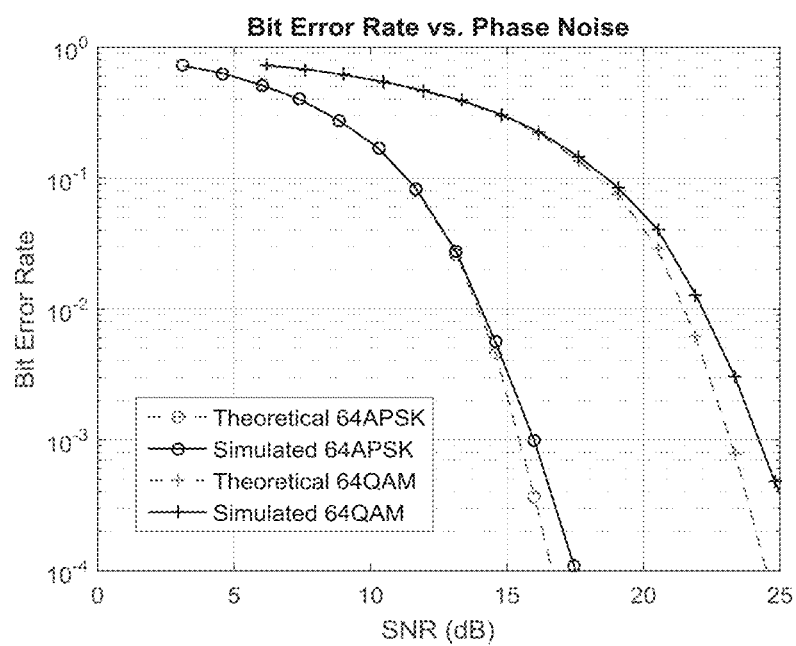
Figure 12:
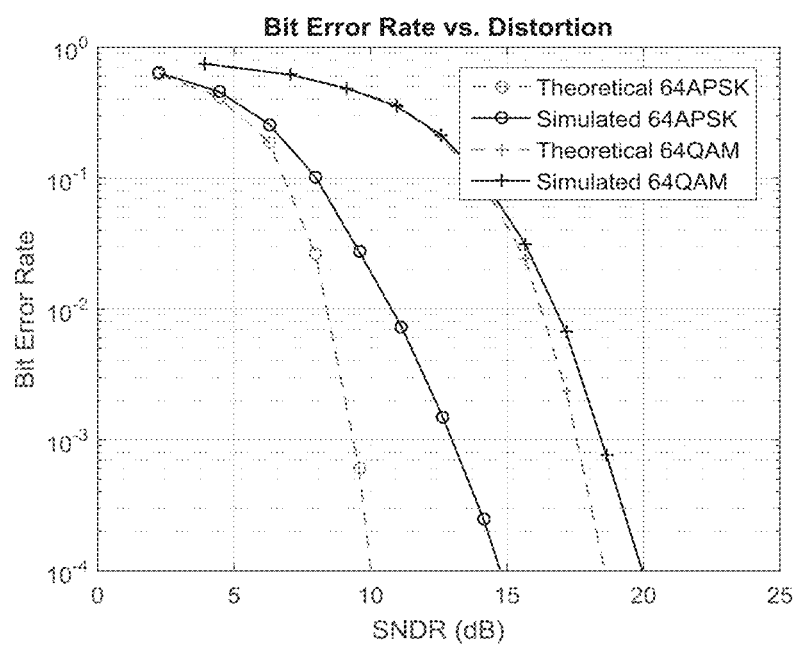
Figure 13:
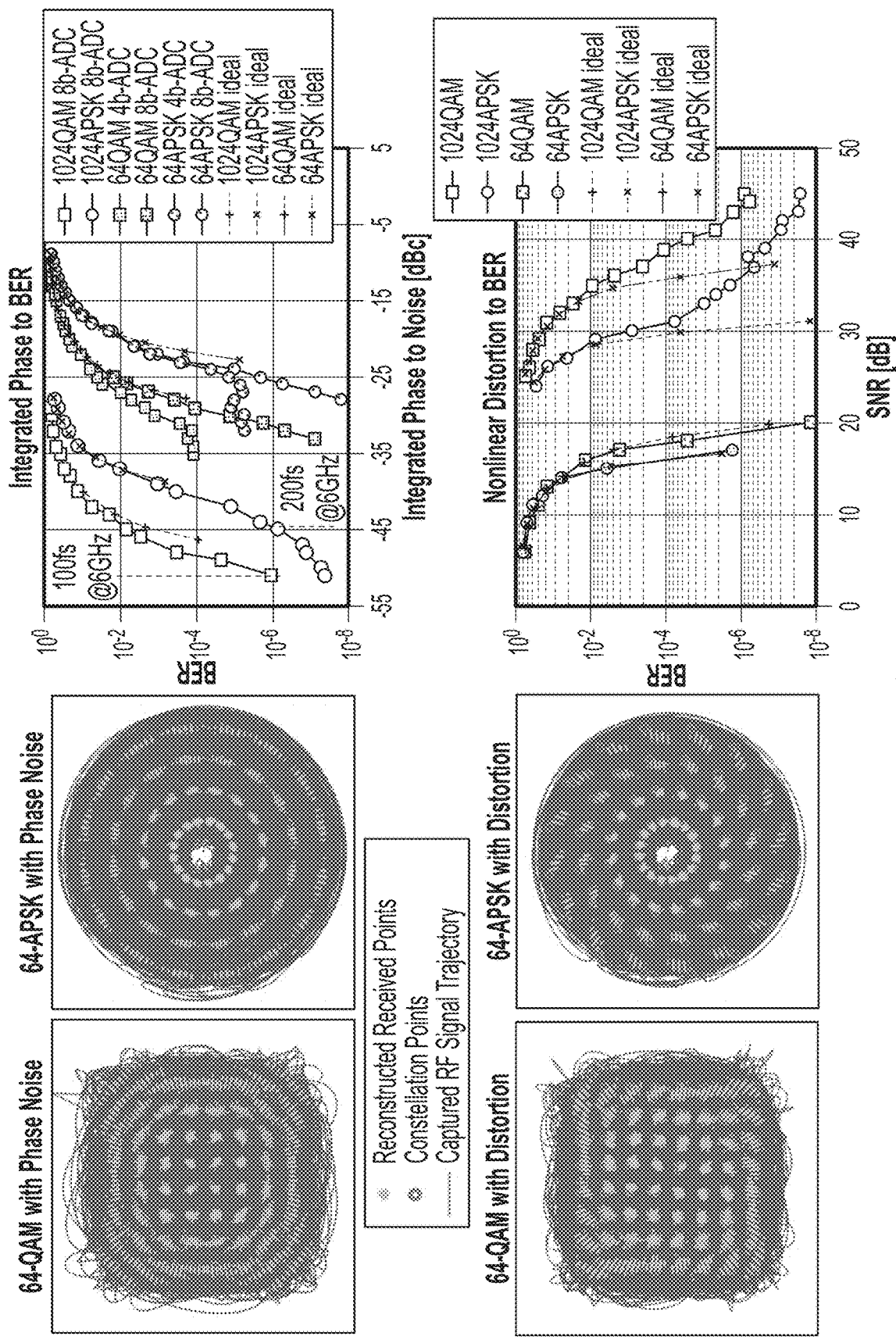

FIG. 9 shows 64-QAM and 64-APSK (2-bit amplitude and 4-bit phase) modulation constellations;

FIG. 10 shows a rectangular 64-QAM and a polar 64-APSK constellations with added phase noise;

FIG. 11 shows a rectangular 64-QAM and a polar 64-APSK constellations with nonlinear distortion;

FIG. 12 shows a comparison of the BER vs. SNR performance of the rectangular 64-QAM signal and the proposed polar 64-APSK signal with added phase noise;

FIG. 13 shows a comparison of the BER vs. SNR performance of the rectangular 64-QAM signal and the proposed 64-APSK signal with nonlinearity distortion, and a comparison of measured BER versus phase noise and SNR for 64-QAM, 1024-QAM, 64-APSK, and 1024-APSK modulations.

DETAILED DESCRIPTION OF THE DRAWING(S)

In the present description, certain terms have been used for brevity, clearness and understanding. No unnecessary limitations are to be applied therefrom beyond the requirement of the prior art because such terms are used for descriptive purposes only and are intended to be broadly construed. The different systems and methods described herein may be used alone or in combination with other systems and methods. Various equivalents, alternatives and modifications are possible within the scope of the appended claims. Each limitation in the appended claims is intended to invoke interpretation under 35 U.S.C. § 112, sixth paragraph, only if the terms "means for" or "step for" are explicitly recited in the respective limitation.

Figure 1:
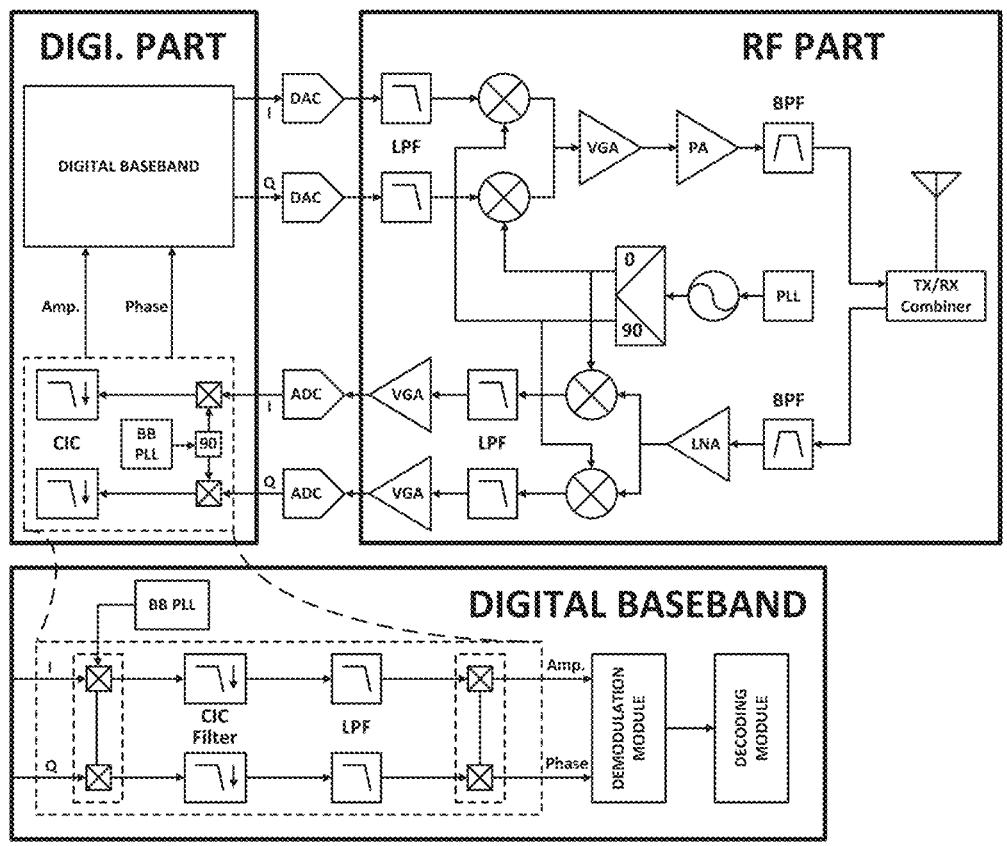
FIG. 1 shows a prior art embodiment of a traditional I/Q wireless transceiver architecture.
Figure 2:
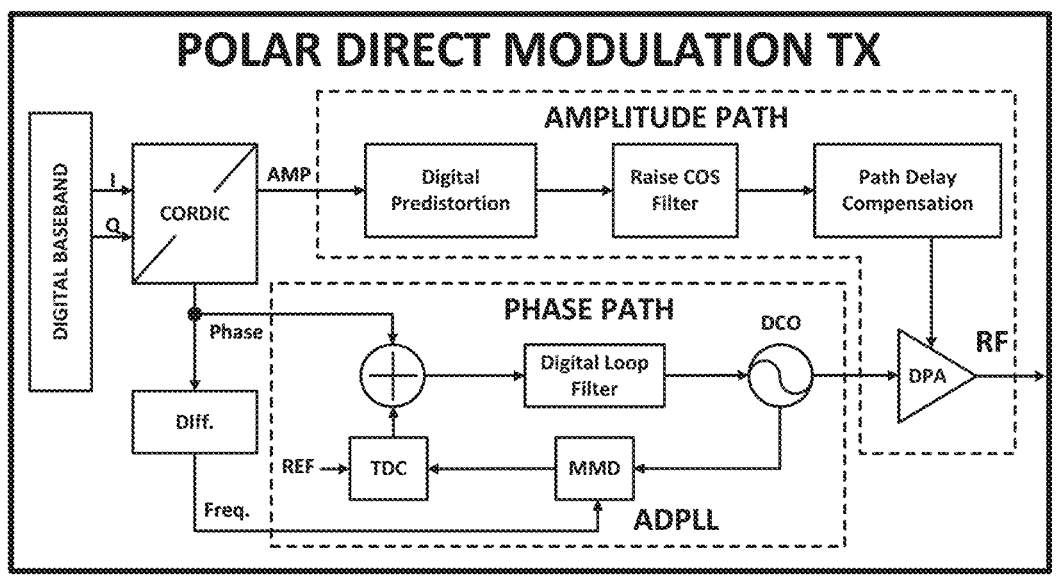
FIG. 2 shows a prior art embodiment of an existing polar direct modulation TX architecture.
Figure 3:
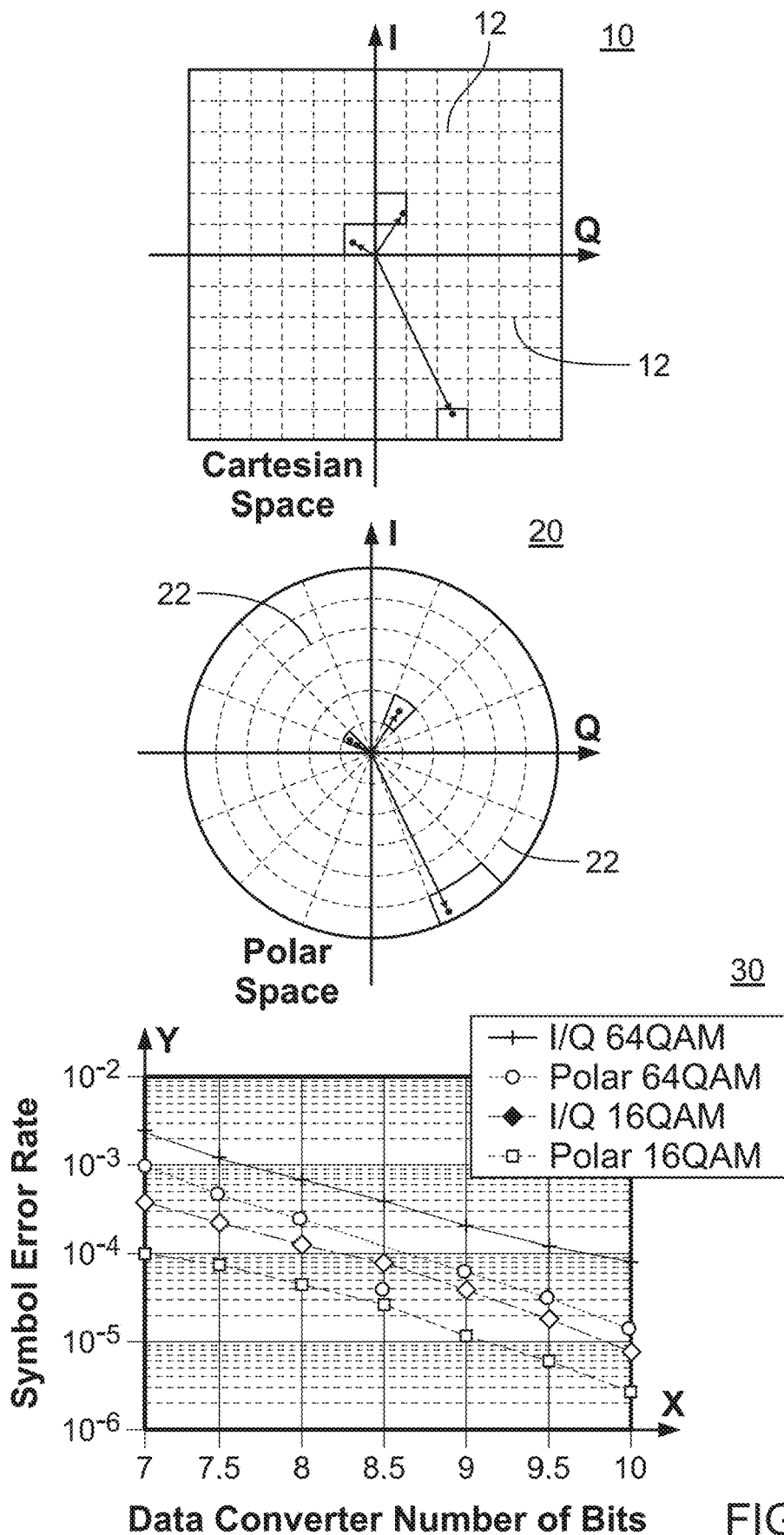
FIG. 3 shows a comparison between a Cartesian I/Q converter and polar converter.
Figure 4:
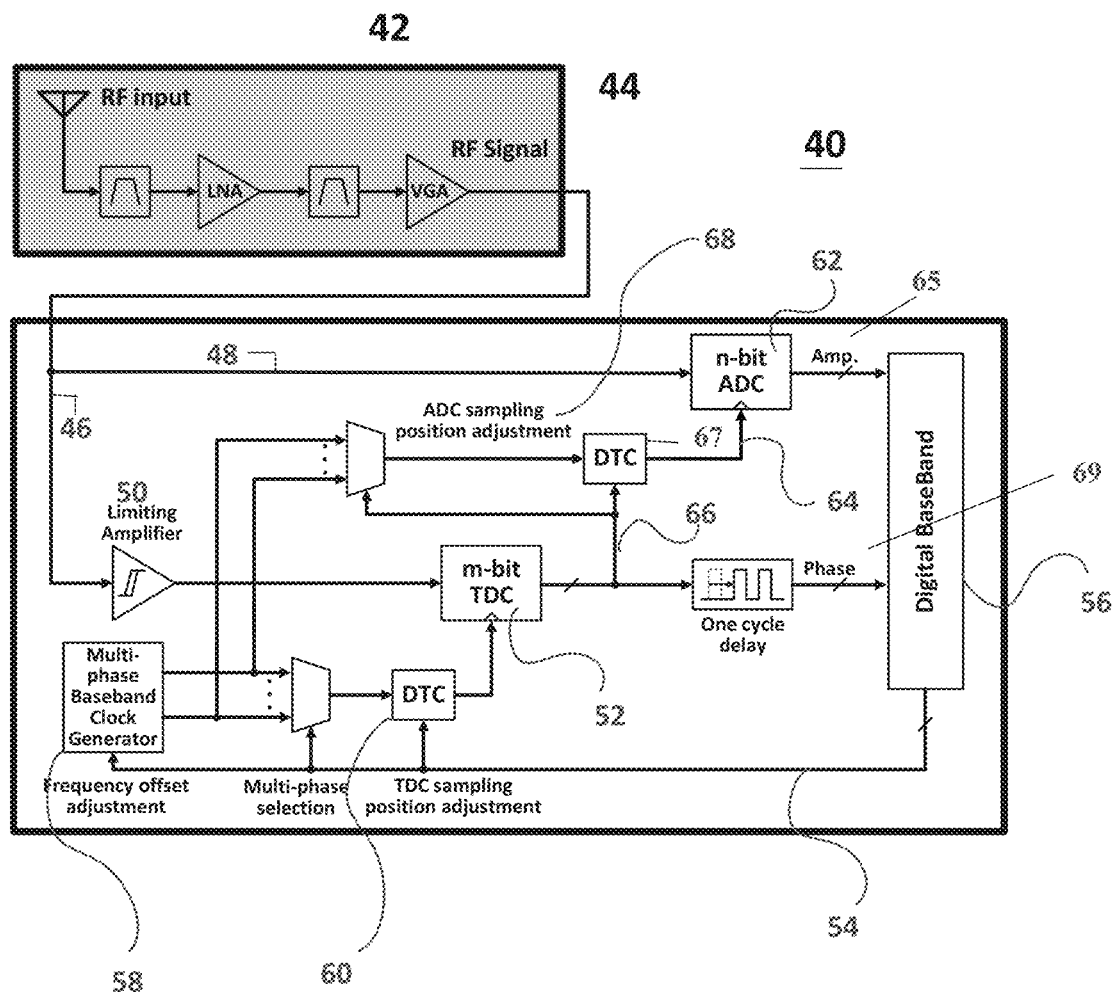
FIG. 4 shows a block diagram of the TDC based hybrid polar data converter for use in a receiver.

The present application includes a novel wireless receiver architecture, which uses both TDCs and ADCs to form a polar data conversion topology. A block diagram of an exemplary architecture of a TDC based hybrid polar data converter 40 is shown in FIG. 4. The antenna 42 captured RF signal 44 is directly down converted to baseband frequency or an IF. Direct-RF sampling is possible if the carrier frequency is within the operational range of the circuits. Instead of splitting into I/Q, the RF signal is fed into TDC path 46 and ADC path 48 directly. In the TDC path 46, the signal will go through a hysteresis buffer 50, which preserves signal's phase information and removes its amplitude. By carefully adjusting the threshold voltages $V_{TH}$ and $V_{TL}$ of the buffer, the hysteresis effect will reduce the noise in phase domain. The phase information of the received modulated signal is resolved with a reconfigurable m-bit TDC 52 by detecting the time difference between the zero-crossing of reference clock and the zero-crossing of the modulated signal. The reference clock of the receiver is synchronized to transmitter based on a feedback loop 54 provided by digital baseband 56. The feedback loop 54 selects the closest phase generated by a multiphase baseband clock generator 58 and further fine tunes the selected phase by adjusting the delay of a digital to time converter (DTC) 60. The use of multi-phase clock will relax the tuning range of delay cell and reduce power consumption. The amplitude of the received modulated signal is captured by a reconfigurable n-bit ADC 62 with the aid of TDC captured phase information. The ADC sampling clock 64 is modulated by TDC measured phase information 66 through another DTC 67 and a multiplexer formed ADC sampling position adjustment module 68. After the conversion, the outputs of ADC and TDC represent the amplitude 65 and phase 69 of the baseband signal. Thus, the proposed architecture can also replace digital domain CORDIC processing modules in the digital baseband.

Figure 5A:
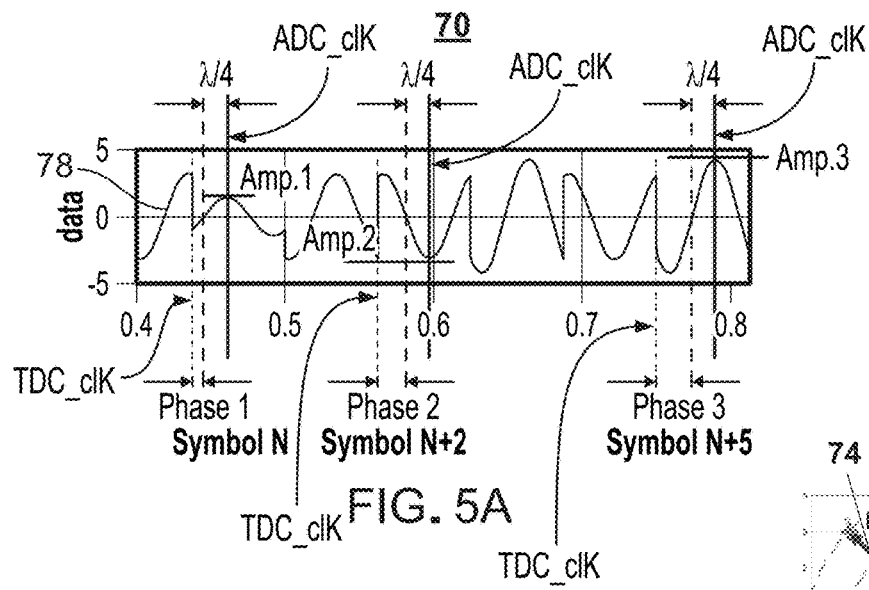
FIG. 5A shows the polar RX operational principle for conversion of a 16-QAM baseband signal which may be used in accordance with the system of the present application, FIG. 5B gives the constellation of the 16-QAM modulation as well as its amplitude and phase quanta.
Figure 5B:
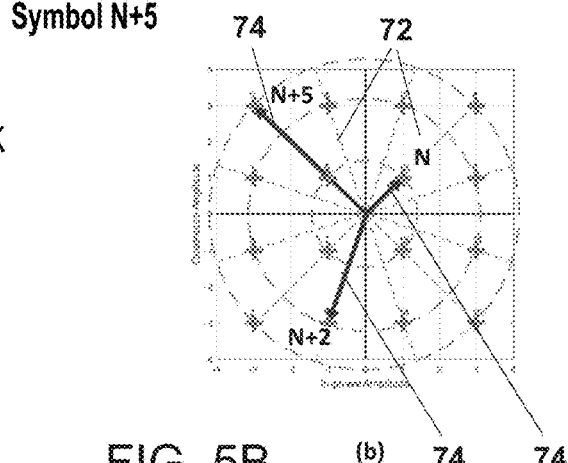
Figure 6:
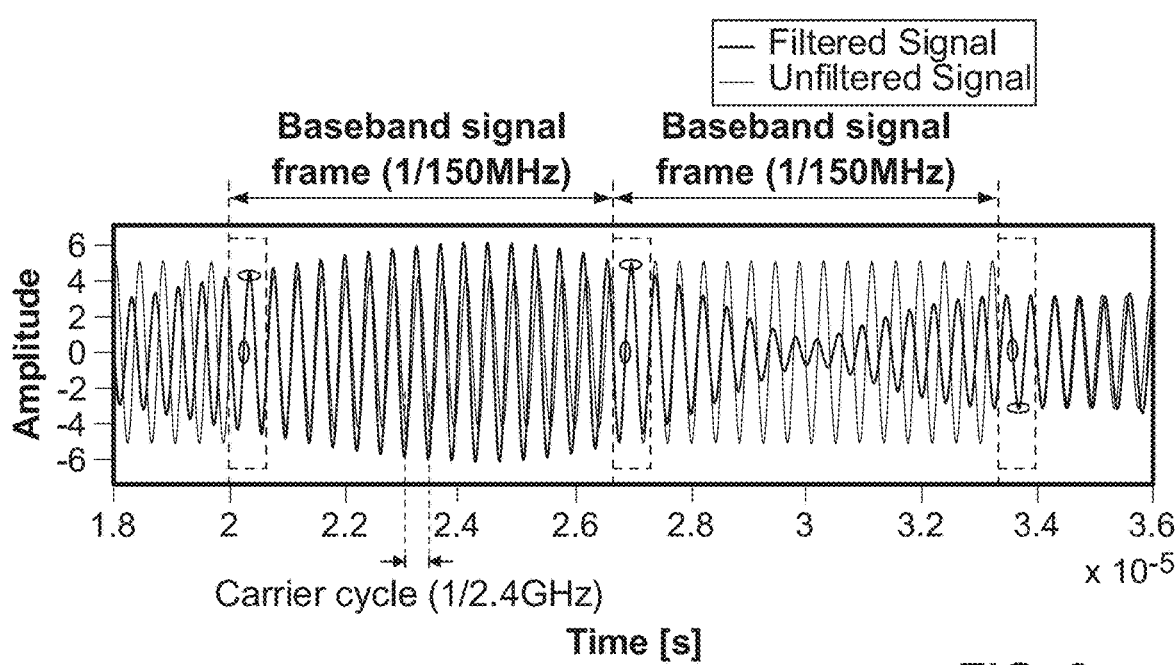
FIG. 6 shows a polar RX operational principle for conversion of a 64-QAM band limited modulated RF signal which may be used in accordance with the system of the present application.

FIGS. 5 and 6 illustrate the phase and amplitude principles 70 of the described TDC based polar receiver. FIGS. 5A and 5B illustrate an example of a 16-QAM unfiltered baseband signal, where there are twelve different phase values 72 and only three different amplitude levels 74 on the constellation plot. FIG. 5A shows the baseband signal 78 in time domain. In a traditional I/Q receiver, the baseband signal 78 would be split into I and Q path and digitized by two ADCs. However, the sample rate of the ADCs needs to be much higher than the baseband signal 78 frequency, in order to gather enough data for the digital baseband processor to recover the phase and amplitude information of the signal.

By examining the constellation of the 16-QAM signal 78 in FIG. 5B, we find out that instead of using two 10 bits ADCs, a 4-bit TDC may be used to obtain the phase information and a 2-bit ADC to identify the amplitude. The data obtained by TDC and ADC is sufficient to demodulate and restore the constellation. Furthermore, the TDC and ADC are able to run at baseband signal frequency, which greatly reduces the data converter's design complexity.

The baseband waveform 78 of a 16-QAM signal shown in FIG. 5A also demonstrates the proposed polar receiver's working principle. Taking 'Symbol N' as an example, initially, the baseband phase locked loop (PLL) frequency needs to be locked to the baseband signal's frequency and aligned the phase to symbol start point. The TDC begins at the start time of a baseband symbol and stops at baseband signal's rising zero-crossing point. The TDC's output represents the phase information of the signal. Then the amplitude needs to be determined. The amplitude of a sinusoid waveform is its maximum amplitude. Taking a closer look of FIG. 5A, the maximum (Amp. 1) occurs at the position of rising zero-crossing point with a λ/4-time delay, as indicated with a solid horizontal line. Thus, if we let the ADC sample the value at that point, we can obtain the amplitude of the signal. With the gathered phase and amplitude data, the baseband signal can be recovered and the constellation restored. Still referring to FIG. 5A, the 'Symbol N+2' and "Symbol N+5" are two additional examples to illustrate the phase and amplitude conversions.

Different from conventional receivers, these two data converters are sampling the signal at baseband signal frequency without oversampling, which is around 10 to 20 MHz for 802.11-a/b/g/n wireless protocols. In a traditional polar transmitter, there is significant bandwidth expansion through I/Q to polar conversion. Conventional ADCs blindly convert the received waveform to digital data, thus needing oversampling. The present time-processing based receiver samples the signal's phase and amplitude information once every symbol period for demodulation. Thus, there is no need to do oversampling.

Normally, multiple filters are applied to the upconverted signal limiting its bandwidth to fit transmitter's requirements. FIG. 6 presents a comparison between a baseband signal before and after a baseband low pass filter "Filtered Signal" vs. "Unfiltered Signal". In a QAM baseband signal, there will be a sudden phase and amplitude change between each symbol 82. This abrupt phase and amplitude jump will introduce high frequency components. The high frequency component needs to be filtered in order to pass a transmission mask defined in wireless communication protocol. With the absence of the high frequency component the signal will be distorted and lead to a higher (Error vector magnitude) EVM level. However, also from FIG. 6, it is shown that the signal in the edges of a symbol period 84 is less distorted than the center of a symbol. Thus, it is more reliable to sample both phase and amplitude information around the edge of a symbol where is less susceptible to the filter.

There is another issue during the ADC sampling position adjustment. Referencing back to FIG. 5A and 'Symbol N+2'. In this symbol period the rising zero-crossing point has already exceeded more than ¾ cycle of the symbol. If we further delay the ADC's sampling position by λ/4, then the ADC will sample a value belonging to the next symbol or outside of the suitable sampling window in the situation presented in FIG. 6. To prevent this kind of situation, the time difference between system clock and falling zero-crossing point is measured by another TDC and used as the phase information. Then the ADC's sampling position is set λ/4 ahead of the falling zero-crossing point.

Figure 7:
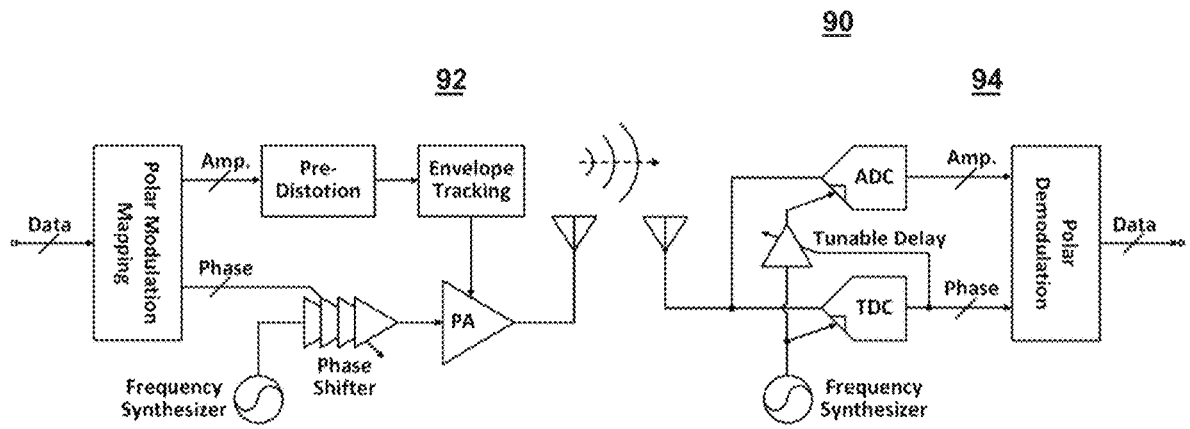
FIG. 7 shows a complete direct-RF polar transceiver system which may be used in accordance with the system of the present application.

Together with existing polar transmitters, a completed wireless direct-RF polar transceiver system 90 is formed as shown in FIG. 7 that can deal with most of existing digital amplitude and phase modulations. The left part of the FIG. 7 presents an abstracted diagram of a well adopted direct-RF polar transmitter 92 architecture, while the right part gives the abstraction of the present polar receiver 94 architecture. This intelligent control of sample point allows us to simplify the architecture of data converters.

Figure 8:
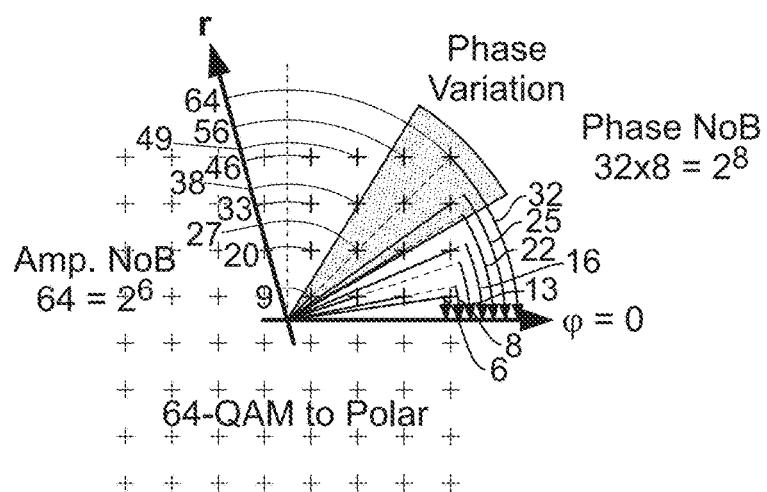
FIG. 8 shows a comparison between QAM and APSK modulated signals and their number of bits requirement.
Figure 8:
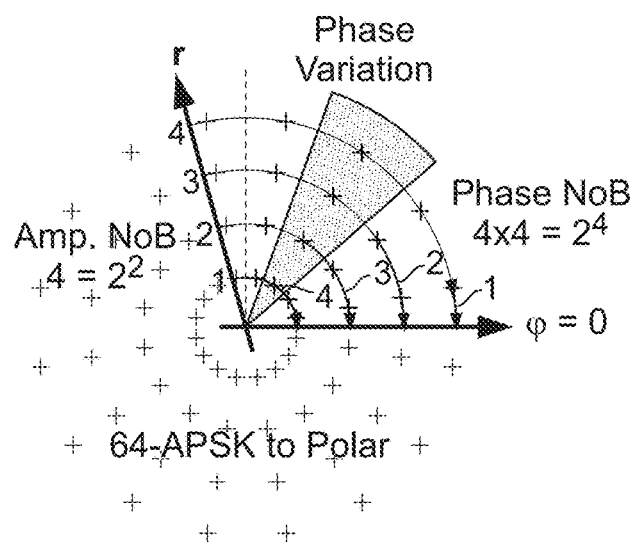

The next generation wireless standards call for highly complexed modulations in order to achieve high data throughput. Complex modulations such as 256-QAM and 1024-QAM put stringent requirements on the phase noise of the PLL, the linearity of the PA and the sample rate as well as the dynamic range of the ADC. Even with the best effort, the state-of-the-art PLLs and PAs can barely support the high-density modulations such as 1024-QAM, leaving no margin for tolerance of other system impairments such as IQ and gain mismatches encountered in conventional Cartesian I/Q transceivers. However, these requirements are much relaxed with the constellations arranged in polar coordinates. A polar based 64 amplitude and phase shift keying (64-APSK) modulation is presented in FIG. 8 and compared with commonly used I/Q Cartesian based 64-QAM modulation. The error span due to phase noise and nonlinear distortion is proportional to the distance from the origin to the constellation point. For Cartesian based QAM modulation, the outer constellation points are much more sensitive to phase variations and nonlinear distortions. On the other hand, APSK can tolerate the same amount of phase noise regardless of its amplitude and thus has better efficiency and impairment tolerance for implementation in a polar system. In addition, the APSK modulations requires less number of bit in both amplitude and phase information in the presented polar transceiver system compared to traditional QAM modulation in the polar system as shown in FIG. 8.

Simulations and Measurements were taken to compare the performances between Cartesian QAM modulations and APSK modulations using the proposed direct RF-sampling polar direct-RF receiver in presence of commonly seen impairments such as phase noise and nonlinear distortion. FIG. 9 and FIG. 10 show the simulated constellations of 64-QAM and 64-APSK modulated signals with the present of phase noise and nonlinear distortion, respectively. It can be clearly seen that less constellation point overlap can be found in 64-APSK modulation compared to 64-QAM modulation. FIG. 11 and FIG. 12 present the theoretical and simulated bit error rate (BER) results versus phase noise and nonlinear distortion characterized as SNR, respectively. APSK modulation achieves better SNR tolerance in both scenarios.

Measurement results are presented in FIG. 13. Transmitted modulated signals from a signal generator source are presented together with the measured reconstructed digital data points of the direct-RF polar receiver output in FIG. 13. BER testing results were measured to compare different complex modulations. As expected, the APSK outperforms the Cartesian QAM modulation when phase noise and nonlinear distortion in form of SNR are presence. To achieve the same BER, 1024-APSK relaxes the phase noise by 6 dB and the SNR by 8 dB, respectively, comparing to its Cartesian 1024-QAM counterpart.

The embodiments of the invention described above are intended to be exemplary only. The scope of the invention is therefore intended to be limited by the scope of the appended claims.

In the foregoing description, certain terms have been used for brevity, clearness, and understanding. No unnecessary limitations are to be inferred therefrom beyond the requirement of the prior art because such terms are used for descriptive purposes and are intended to be broadly construed. The different configurations, systems, and method steps described herein may be used alone or in combination with other configurations, systems and method steps. It is to be expected that various equivalents, alternatives and modifications are possible within the scope of the appended claims.

The invention claimed is:

1. A time-to-digital converter-based hybrid polar data converter (converter) for a polar receiver, comprising:
    a time-to-digital converter (TDC) with a reconfigurable temporal resolution and a variable number of bits input, wherein the TDC detects phase information of a received signal;
    an analog-to-digital converter (ADC), wherein the ADC detects an amplitude information of the received signal;
    a first tunable temporal delay cell configured in an ADC path and a plural path of fixed temporal delay cells located in the ADC path, wherein the first tunable temporal delay cell is controlled by the TDC's output to precisely set the ADC sample position at a maximum of a symbol period; and
    a digital domain one cycle delay coupled to the output of the TDC to align the TDC's output with the ADC's output.

2. The converter of claim 1 further comprising a hysteresis buffer copied to an input of the TDC, wherein the hysteresis buffer eliminates signal amplitude information.

3. The converter of claim 1 further comprising a clock synthesis module with a multi-phase output, wherein the module is controlled by a feedback signal, the feedback signal is used to synchronize a local clock phase with the received signal.

4. The converter of claim 3 further comprising a multi-phase selection multiplexer coupled to an output of the baseband clock synthesis module, wherein the multiplexer is controlled by the digital baseband and selects a closest phase generated by the synthesis module for an approximate local clock synchronization.

5. The converter of claim 4 further comprising a second tunable temporal delay cell coupled to an output of the multi-phase selection multiplexer, wherein the second tunable temporal delay cell further controls the local clock phase for fine local clock synchronization.

6. The converter of claim 1, wherein the received signal is a modulated signal on an RF signal.

7. The converter of claim 1, wherein an ADC sampling position for detecting the amplitude information is determined by the received phase information.

8. The converter of claim 1, such that the outputs include digitalized phase and amplitude data.

9. The converter of claim 1, wherein the first tunable temporal delay cell is controlled by the output of the TDC to precisely set the ADC sample position at a maximum of a symbol period.

10. A polar analog-to-digital conversion method utilizing a time-to-digital based hybrid polar data converter (converter), comprising:
    approximately aligning a local clock phase by selecting a closest phase generated from a multi-phase local clock synthesis block;
    finely aligning a local clock phase by adjusting a tunable temporal delay cell for the fine alignment; adjusting a tunable delay in an analog-to-digital converter (ADC) path based on an upper and lower threshold value settings of a hysteresis buffer;
    detecting a time from a local clock rising edge using a time-to-digital converter (TDC) block obtained in the aligning steps to a rising zero-crossing point and a falling zero-crossing point of a received signal, and converting the time interval information into corresponding digital codes;
    adjusting an ADC sample position by adjusting the tunable delay based on an output of the TDC and selecting one signal delay path based on a position of the received signal's rising and falling zero-crossing points.

11. The conversion method according to claim 10, comprising:
    adjusting a sampling clock of the ADC to the desired sampling position based on the TDC's output with a tunable temporal delay cell.

12. The conversion method according to claim 11, further comprising selecting with a multiplexer one of two signals passing through two delay paths based on a choice of rising or falling zero-crossing point, wherein the two paths of signal delay are in the ADC path, one including a one and ¼ cycle temporal delay corresponding to the falling zero crossing point detection of the TDC, and the other one including ¾ cycle temporal delay corresponding to the rising zero-crossing point detection of the TDC.

13. The conversion method according to claim 12 further comparing, calculating a compensation gain based on the ADC sample position in a symbol period and the pulse shape filter profile parameters to restore the nonfiltered signal with time domain signal processing.

14. A time-to-digital converter-based hybrid polar data converter (converter) for a polar receiver, comprising:
    a time-to-digital converter (TDC) with a reconfigurable temporal resolution and a variable number of control bits input, wherein the TDC detects a phase information of a received signal, wherein the received signal is an analog signal on an RF signal;
    an analog-to-digital converter (ADC), wherein the ADC detects an amplitude information of the received signal, wherein an ADC sampling position for detecting the amplitude information is determined by the received phase information;
    a hysteresis buffer copied to an input of the TDC, wherein the hysteresis buffer eliminates signal amplitude information;

a baseband clock synthesis module with a multi-phase output, wherein the module is controlled by a feedback signal, the feedback signal received from a digital baseband and the feedback signal is used to synchronize a local clock phase with the received signal;

a multi-phase selection multiplexer coupled to an output of the clock synthesis module, wherein the multiplexer selects a closest phase generated by the synthesis module for an approximate local clock synchronization;

a first tunable temporal delay cell configured in an ADC path and a plural path of fixed temporal delay cells located in the ADC path, wherein the first tunable temporal delay cell is controlled by the TDC's output to precisely set the ADC sample position at a maximum of a symbol period;

a second tunable temporal delay cell coupled to an output of the multi-phase selection multiplexer, wherein the second tunable temporal delay cell further controls the local clock phase for fine local clock synchronization;

and a digital domain one cycle delay coupled to the output of the TDC to align the TDC's output with the ADC's output, such that the outputs include digitalized phase and amplitude data.

* * * * *